United States Patent [19]
Miura

[11] Patent Number: 5,901,109
[45] Date of Patent: May 4, 1999

[54] SEMICONDUCTOR MEMORY DEVICE CAPABLE OF HIGHER-SPEED OPERATION AND ACTIVATED IN SYNCHRONISM WITH CLOCK

[75] Inventor: Naoki Miura, Tokyo, Japan

[73] Assignee: Oki Electric Industry Co., Ltd., Tokyo, Japan

[21] Appl. No.: 08/941,656

[22] Filed: Sep. 30, 1997

[30] Foreign Application Priority Data

Apr. 25, 1997 [JP] Japan .................................. 9-123357

[51] Int. Cl.[6] ...................................................... G11C 8/00
[52] U.S. Cl. ...................... 365/233; 365/189.05; 365/194
[58] Field of Search ............................... 365/233, 189.05, 365/194, 230.03

[56] References Cited

U.S. PATENT DOCUMENTS

| | | | |
|---|---|---|---|
| 5,668,774 | 9/1997 | Furutani | 365/233 |
| 5,703,829 | 12/1997 | Suzuki et al. | 365/233 |
| 5,708,614 | 1/1998 | Koshikawa | 365/198.05 X |
| 5,748,560 | 5/1998 | Sawada | 365/233 |

FOREIGN PATENT DOCUMENTS

| | | |
|---|---|---|
| 6-96579 | 4/1994 | Japan . |
| 6-76567 | 8/1994 | Japan . |
| 7-85675 | 3/1995 | Japan . |

OTHER PUBLICATIONS

Yukinori Kodama et al., "A 150–MHz 4–Bank 64M–bit SDRAM with Address Incrementing Pipeline Scheme," 1994 Symposium on VLSI Circuits Digest of Technical Papers; pp. 81–82.

*Primary Examiner*—Huan Hoang
*Attorney, Agent, or Firm*—Jones, Volentine, Steinberg & Whitt, L.L.P.

[57] ABSTRACT

A semiconductor memory device includes a memory array for outputting data stored in a memory cell at an address corresponding to an address signal generated according to an address control signal synchronized with a clock pulse, a data reading circuit for reading a data signal outputted from the memory array, an activation signal generating circuit for receiving a delay signal generated based on the address signal and generating an activation signal for activating the data reading circuit to read the data signal outputted from the memory array into the data reading circuit, and a data output circuit for outputting a data signal outputted from the data reading circuit according to the input of an output enable signal synchronized with the clock pulse.

15 Claims, 4 Drawing Sheets

SEMICONDUCTOR MEMORY DEVICE CAPABLE OF HIGHER-SPEED OPERATION AND ACTIVATED IN SYNCHRONISM WITH CLOCK

BACKGROUND OF THE INVENTION

1. Field of the Invention

This invention relates to a semiconductor memory device, and particularly to a synchronous DRAM (Dynamic Random Access Memory) for outputting control signals for read and write operations, each of which is synchronized with a clock pulse.

2. Description of the Related Art

A synchronous DRAM (hereinafter called "SDRAM") is known as a high-speed operable DRAM. An SDRAM of an address-increment pipeline scheme system disclosed in "1994 Symposium on VLSI Circuits Digest of Technical Papers" published from IEEE, 1994, pages 81–82 has been proposed as this type of SDRAM.

In the conventional SDRAM, a column address signal is latched in a first stage, data read from a memory array supplied with the column address signal is latched in a second stage. In the subsequent third stage, the read data is outputted through an output buffer activated with an external clock as a trigger.

In such a pipeline process, the respective stages need to be distributed to even or uniform numbers of clock pulses respectively. A clock frequency is considered to increase in order to achieve the high-speed operation. However, the operation of the first stage requiring the longest processing time interferes with the increase in clock frequency. Therefore, the memory array is divided into two arrays to achieve the high-speed operation in the above-described scheme system. Further, the first stage is divided into two blocks for purposes of the divided two arrays. In the divided individual blocks of the first stage, the reading of data from the divided individual arrays corresponding to the respective blocks is processed in parallel to achieve the high-speed operation.

In the conventional SDRAM, however, the time between latching the column address signal, i.e., inputting the address signal to the memory array and reading data from the memory array requiring the longest processing time subsequent to its input is basically controlled in synchronism with the clock.

Therefore, the length of the processing time between the input of the address signal to the memory array and the reading of the data from the memory array has no flexibility.

In the conventional SDRAM as is understood from this point of view, when the frequency of a master clock is being set to, e.g., 125 MHz (clock cycle is being set to 8 ns), a high-speed operation at 125 MHz or more cannot be achieved even if the processing in the first stage is done in a cycle less than or equal to this clock cycle.

SUMMARY OF THE INVENTION

With the foregoing in view, it is therefore an object of the present invention to provide an SDRAM capable of providing a high-speed operating process.

It is another object of the present invention to provide an SDRAM excellent in flexibility, wherein a processing time between inputting an address signal to a memory array and reading data from the memory array is not restrained by a clock.

According to one aspect of the present invention, for achieving the above objects, there is provided a semiconductor memory device which basically comprises: a memory array for receiving an address signal outputted according to an address control signal synchronized with a clock pulse and outputting data stored in a memory cell located at an address corresponding to the address signal; a data reading circuit for reading a data signal outputted from the memory array; an activation signal generating circuit for receiving a delay signal outputted based on the address signal and outputting an activation signal for activating the data reading circuit to read the data signal outputted from the memory array into the data reading circuit; and a data output circuit for outputting a data signal produced from the data reading circuit according to the input of an output enable signal synchronized with the clock pulse.

In the semiconductor memory device according to the present invention, the address signal to be received by the memory array is inputted synchronously with the clock pulse according to the address control signal synchronized with the clock pulse. The data reading circuit for reading the output data stored in the memory cell, which corresponds to the address signal, is activated in response to the activation signal outputted from the activation signal generating circuit so as to read the output data from the memory array.

The activation signal for activating the data reading circuit is not generated in association with a control signal synchronized with the clock pulse and an address signal generated according to the control signal but is generated according to a signal delayed by a predetermined time with respect to the address signal.

Therefore, the activation of the data reading circuit for reading the data from the memory array is not controlled synchronously with the clock and is done asynchronously with a predetermined time delay after the input of the address signal to the memory array.

Thus, the processing time between the input of the address signal to the memory array and the reading of the data from the memory array is not restrained by the clock and can be set independent of a clock frequency. Therefore, the operation of a system is capable of having flexibility.

Further, the present invention is advantageous to the achievement of a high-speed operation because the asynchronization of the operation of the data reading circuit can provide an increase in clock frequency without reference to the data read operation of the data reading circuit.

The delay signal for activating the activation signal generating circuit based on the address signal can be obtained by inputting the address signal to a delay circuit.

The data reading circuit is capable of having the function of reading the data signal outputted from the memory array upon receipt of the activation signal and latching an output thereof corresponding to the data signal until the data reading circuit receives the subsequent activation signal therein.

A data transmission control circuit for controlling the transfer of the data signal outputted from the data reading circuit to the data output circuit can be inserted between the data reading circuit and the data output circuit.

A latency setting circuit for generating a latency signal for providing the data output produced from the data output circuit with a delay of a predetermined number of clock pulses, which is developed from the address control signal, can be provided in relation to the activation signal generating circuit and the data output circuit.

In the example provided with the latency setting circuit, the activation signal generating circuit transmits a control signal for providing a delay of a predetermined number of clock pulses for the transfer of data from the data reading circuit to the data output circuit, to the data transmission control circuit when the activation signal generating circuit receives a predetermined latency signal from the latency setting circuit.

The latency setting circuit is capable of selectively setting three types of latencies composed of a latency 1, a latency 2 and a latency 3. The latency setting circuit can transmit latency signals for providing delays of a zero clock pulse and one clock pulse to the data output circuit as the enable signals respectively upon setting of the latency 1 and said latency 2, whereas when the latency 3 is set, the latency setting circuit can transmit a latency signal for providing a delay of two clock pulses to the data output circuit and the activation signal generating circuit as the enable signal.

The data output circuit can output a predetermined voltage value to an input terminal thereof as an initialized value each time the data output circuit receives an enable signal therein. The activation signal generating circuit can activate the data transmission control circuit so as to allow the data outputs produced from the data reading circuit to pass through the data output circuit without a time delay unless the activation signal generating circuit receives the latency signal indicative of the latency 3 from the latency setting circuit.

As the memory array, a memory array having a plurality of bit lines and a plurality of word lines can be used. At this time, a CAS signal sent to a column decoder can be used as the address control signal. The address signal sent from the column decoder to the memory array can be set as a column selection signal.

In the example in which the column selection signal is used as the address signal, the column selection signal sent from the column decoder is transmitted through the delay circuit so as to become the delay signal.

As the memory array, a memory array can be used which outputs a pair of mutually-complementary data signals from a bit line for a memory cell corresponding to the column selection signal and a bit line paired with the bit line to the data reading circuit in response to the column selection signal.

The data reading circuit can be configured by incorporating the above-described latch function into a read amplifier having a differential amplifying function. The read amplifier outputs a pair of complementary signals obtained by amplifying the pair of data signals to predetermined values respectively, based on the difference in voltage between the pair of data signals.

Further, the data transmission control circuit can be composed of a logic circuit including a pair of NOR circuits each having a pair of input terminals. The pair of complementary signals is inputted to one input terminals of the pair of NOR circuits. The control signal outputted from the activation signal generating circuit is inputted to the other input terminals thereof. Signals outputted from the pair of NOR circuits are inputted to the data output circuit.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The present invention will hereinafter be described in detail by embodiments illustrated in the accompanying drawings.

Figure 1:
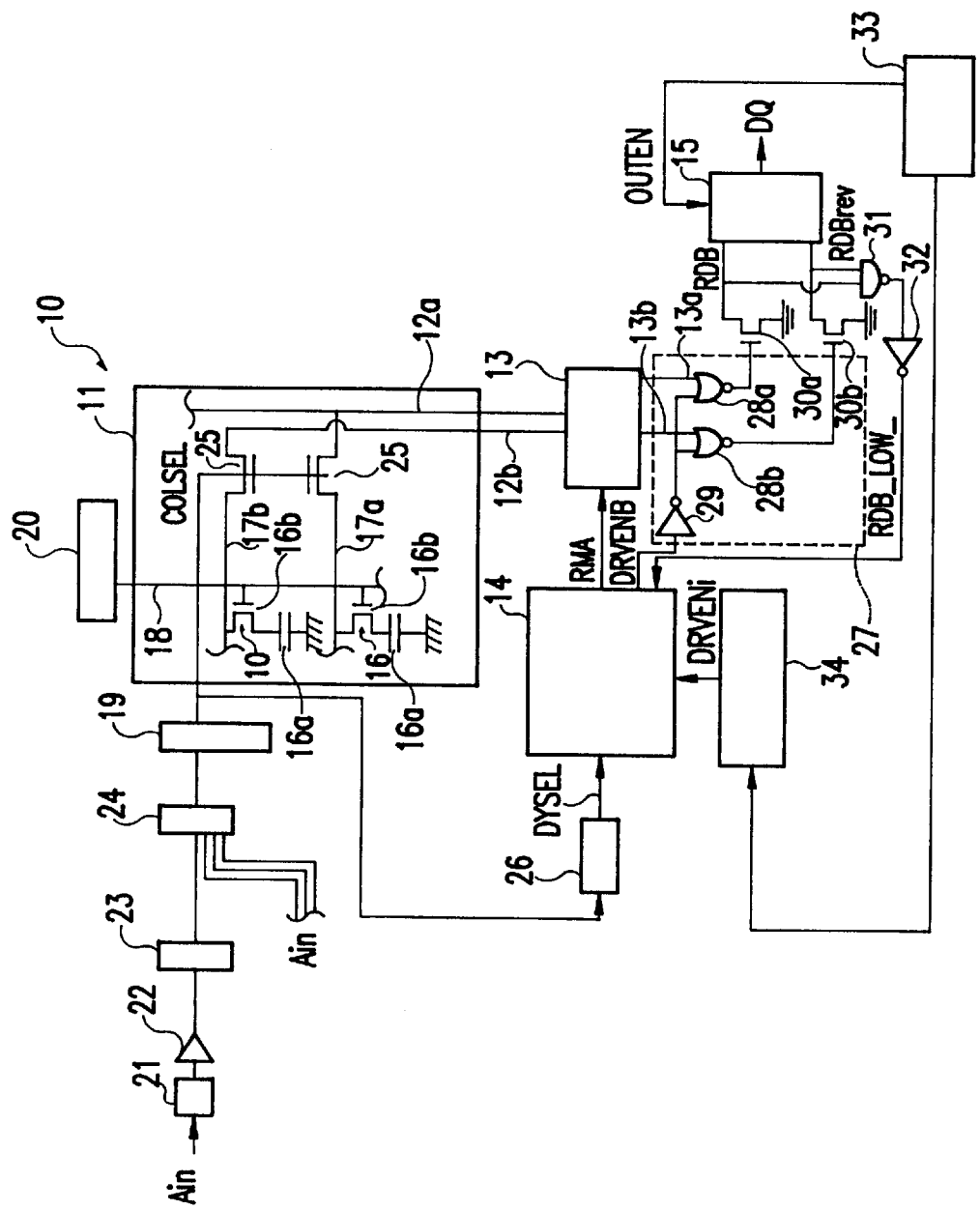
FIG. 1 is a block diagram showing a semiconductor memory device according to the present invention.

FIG. 1 is a block diagram showing a semiconductor memory device 10 according to the present invention.

The semiconductor memory device 10 includes a dynamic memory array 11, a data reading circuit 13 electrically connected to a pair of data output lines 12 (12a and 12b) of the memory array 11, an activation signal generating circuit 14 for generating an activation signal for activating the data reading circuit 13, and a data output circuit 15 for receiving therein a data output sent from the data reading circuit 13 and outputting it therefrom in synchronism with a master clock pulse (CLK).

As is well known per se in the art, the memory array 11 is a dynamic memory array having a number of dynamic memory cells 16 each comprising a memory capacitor 16a for storing data as the presence or absence of an electric charge and a switching transistor 16b electrically connected in series with the capacitor 16a, and a number of bit lines 17 (17a and 17b) and word lines 18 electrically connected to their corresponding memory cells and mutually arranged in matrix form.

The memory array 11 is provided with a column decoder 19 in relation to the bit line or data line 17 to select the memory cell 16 corresponding to the object to write data therein or read it therefrom. Further, the memory array 11 is also provided with a row decoder 20 in relation to the word line 18.

When the row decoder 20 receives a RAS (Row Address Strobe) signal of address control signals, which is one control signal synchronized with a clock pulse, from, for example, a central processing unit (not shown) upon selection of the memory cell 16, an address signal for selecting a row is inputted to the memory array 11 through the row decoder 20. As is well known in the art, the corresponding word line 18 is selected by the row selection address signal. Since the path along which the row address selection signal is inputted to this word line 18, partly shares the use of that for a column address selection signal to be described later upon address multiplex in the same manner as in the prior art, it will be omitted for simplicity of illustration and description.

When the row decoder 20 selects the word line 18 corresponding to the row address selection signal in response to the RAS signal, a CAS (Column Address Strobe)

signal synchronized with the clock pulse is subsequently inputted to its corresponding column decoder 19.

A plurality of address input pads 21, input buffers 22 and input latch circuits 23 corresponding to the number of bits are electrically connected to their corresponding column decoders 19 as address signal input paths. Further, the column decoders 19 include predecoders 24 for producing predetermined column address selection signals (COLSEL) according to a collection of respective bit information, respectively.

When the corresponding column decoder 19 receives a CAS signal corresponding to an address signal therein, it sends a column address selection signal (COLSEL) produced by the predecoder 24 to the memory array 11.

When the memory array 11 receives the column address selection signal (COLSEL) from the column decoder 19, a bit line 17a corresponding to the column decoder 19 and a bit line 17b paired with the bit line 17a are electrically connected to data output lines 12a and 12b through switching transistors 25 respectively as is well known in the art.

Upon reading data, a read voltage corresponding to about half of a drive voltage is applied to the pair of bit lines 17a and 17b in advance to obtain complementary signals at the pair of bit lines 17a and 17b as is well known in the art. Thereafter, a switching transistor 16b connected to a memory capacitor 16a, which is electrically connected to one bit line 17a specified by the column address selection signal, is turned on.

Therefore, according to the presence or absence of the electric charge stored in the above-described memory capacitor 16a, a potential difference occurs between one bit line 17a electrically connected to the corresponding memory capacitor 16a and the other bit line 17b paired with the bit line 17a, which brings a switching transistor 16b connected to its corresponding memory capacitor 16a to an off state.

The potential difference is read by the data reading circuit 13 having a latch function through its corresponding data output lines 12a and 12b. However, the read operation of the data reading circuit 13 is not performed until data on the data output line pair 12 is stabilized.

In the semiconductor memory device 10 according to the present invention, the read operation of the data reading circuit 13 is controlled by a delay signal (DYSEL) sent from the activation signal generating circuit 14 without being under the control of the control signal synchronized with the clock pulse.

In order to generate the delay signal (DYSEL), for example, a commonly well-known delay line or a delay circuit 26 composed of a buffer circuit is electrically connected to the activation signal generating circuit 14.

The delay circuit 26 is supplied with the column address selection signal (COLSEL) outputted from the corresponding column decoder 19. This column address selection signal (COLSEL) passes through the delay circuit 26 to produce a delay signal (DYSEL) delayed by a predetermined time interval from the input of the column address selection signal (COLSEL) to the memory array 11.

The delay signal (DYSEL) produced by the delay circuit 26 is inputted to the activation signal generating circuit 14. Upon receipt of the delay signal (DYSEL) by the data reading circuit 13, the activation signal generating circuit 14 basically transmits an activation signal (RMA) to the data reading circuit 13 supplied with the delay signal (DYSEL). When the data reading circuit 13 is activated in response to the activation signal (RMA) so as to read the data from the data output line pair 12 (12a and 12b).

The data reading circuit 13 can comprise a read amplifier having a difference amplifying function. Under the data read operation of the data reading circuit 13, the data reading circuit 13 amplifies a voltage applied to the selected data output line 12a to a predetermined voltage value, e.g., a TTL voltage value, based on a differential voltage between both the data output lines 12a and 12b and outputs data about the amplified voltage value and data "L" or "H" complementary to the data to output lines 13a and 13b thereof. Since the data reading circuit 13 has a latch function, the data on the output lines 13a and 13b thereof are held until the data reading circuit 13 receives a subsequent activation signal (RMA) from the activation signal generating circuit 14.

The output lines 13a and 13b of the data reading circuit 13 are electrically connected to the data output circuit 15 through a data transmission control circuit 27.

The data transmission control circuit 27 includes a pair of NOR circuits 28a and 28b each having a pair of input terminals.

The output lines 13a and 13b of the data reading circuit 13 are respectively electrically connected to one input terminals of the NOR circuits 28a and 28b. A drive enable signal (DRVENB) for interrupting the data transmission control circuit 27 in relation to latency to be described later is inputted to the other input terminals of the NOR circuits 28a and 28b via an inverter 29.

Output terminals of the NOR circuits 28a and 28b are electrically connected to their corresponding gates of MOS transistors 30a and 30b respectively electrically connected to input terminals of the data output circuit 15. The drive enable signal (DRVENB) is shown in a timing chart to be described later and normally kept in an "L" state. Further, the drive enable signal is inverted by the inverter 29, followed by supply to the NOR circuits 28a and 28b.

Therefore, when the drive enable signal (DRVENB) is in the "L" state, the two MOS transistors 30a and 30b are kept in an off state regardless of the value of the data on the output lines 13a and 13b of the data reading circuit 13. Accordingly, the data on the output lines 13a and 13b are not inputted to the data output circuit 15 in this state.

On the other hand, when the drive enable signal (DRVENB) is brought to an "H" state, the voltages inputted to the respective one input terminals of the NOR circuits 28a and 28b, which are electrically connected to the inverter 29, are respectively brought to an "L" state. Therefore, the MOS transistor 30a or 30b electrically connected to either one kept in the "L" state, of the NOR circuits 28a and 28b, which is supplied with an input on either one of the output lines 13a and 13b of the data reading circuit 13, is held in conduction. As a result, the data on the data output line pair 12 are transmitted to their corresponding input terminals of the data output circuit 15.

The data output circuit 15 comprises a data output buffer circuit for maintaining both input terminals at a predetermined drive voltage value in a preset state. When the data output circuit 15 receives an output enable signal (OUTEN) at its trigger terminal, the data output circuit 15 outputs the input applied to the input terminal (RDB) as an output signal (DQ).

Namely, the data reading circuit 13 outputs the complementary data on the data output lines 12a and 12b to the data transmission control circuit 27 in response to the activation signal (RMA) produced asynchronously with the clock pulse from the activation signal generating circuit 14. The data transmission control circuit 27 transmits the complementary data outputted from the data reading circuit 13 to the input terminals of the data output circuit 15 in response to the "H" of the drive enable signal (DRVENB).

Read data corresponding to the data on, for example, the data output line 12*a* associated with the selected memory cell 16 is transmitted to its corresponding input terminal (RDB) of both input terminals of the data output circuit 15. Upon receipt of the output enable signal (OUTEN), the data output circuit 15 outputs the read data inputted to the input terminal (RDB) thereof as the output signal (DQ).

Further, when the data (DQ) is in the output state, the pair of input terminals of the data output circuit 15 is kept in a state of being inputted with the complementary signals and is set free from the preset state.

In the preset state, the two input terminals of the data output circuit 15 is maintained at the drive voltage value or "H" as described above. In the preset state, a reset signal (RDBLOW) fed back to the activation signal generating circuit 14 through a NAND 31 and an inverter 32, is maintained at "H".

However, the reset signal (RDBLOW) fed back to the activation signal generating circuit 14 is brought to "L" owing to the release of the present state. Therefore, the drive enable signal (DRVENB) is returned to "L" because the subsequent data is outputted from the data reading circuit 13. Thus, the data transmission control circuit 27 keeps the data reading circuit 13 and the data output circuit 15 in a cut-off state. Further, the data output circuit 15 is brought to the preset state again.

Thus, the activation of the reading circuit for reading the data from the memory array is not controlled synchronously with the clock and is asynchronously controlled with a predetermined time delay after the address signal has been inputted to the memory array.

Therefore, the processing time between the input of the address selection signal (COLSEL) to the memory array 11 and the reading of the data from the memory array 11 is not restrained by the clock pulse. Thus, the processing time can be set independent of a clock frequency owing to the setting of the delay circuit 26 and hence flexibility can be given to the operation of a system.

Further, the asynchronization of the operation of the data reading circuit can provide an increase in clock frequency without reference to the data read operation of the data reading circuit.

Moreover, a latency setting circuit 33 and a latency control circuit 34 advantageous to high-speed promotion are provided in relation to the activation signal generating circuit 14 in the embodiment illustrated in FIG. 1.

As is well known in the art, the latency setting circuit 33 is capable of selectably setting a latency signal corresponding to CAS latency 1 having no delay in clock pulse from the CAS signal indicative of the address control signal, a latency signal corresponding to CAS latency 2 delayed by one clock pulse from the CAS signal and a latency signal corresponding to CAS latency 3 delayed by two clock pulses from the CAS signal, according to its setting.

When, for example, the CAS latency 1 is set by the latency setting circuit 33, an output enable signal (OUTEN) is inputted to the trigger input terminal of the data output circuit 15 in timing free of developing the delay in clock pulse in the CAS signal.

When the CAS latency 2 is set by the latency setting circuit 33, an output enable signal (OUTEN) is inputted to the trigger input terminal of the data output circuit 15 in timing provided to develop the delay of one clock pulse in the CAS signal.

When the CAS latency 3 is set by the latency setting circuit 33, an output enable signal (OUTEN) is inputted to the trigger input terminal of the data output circuit 15 in timing provided to develop the delay of two clock pulses in the CAS signal.

As a result, the CAS latency suitable for the output (DQ) produced from the data output circuit 15 can be set in a manner similar to the conventional setting of latency. Thus, the data can be read at a high speed.

When the CAS latency 1 and the CAS latency 2 are set, the data outputted from the data reading circuit 13 do not overlap at the input terminals of the data output circuit 15. However, when the CAS latency 3 is set, the subsequent data outputted from the data reading circuit 13 might overlap at the input terminals of the data output circuit 15.

In order to reliably prevent the overlapping of the data upon setting the latency 3, the latency control circuit 34 for controlling the operation of the activation signal generating circuit 14 is electrically connected to the latency setting circuit 33 in regard to the setting of the latency 3.

Figure 2:
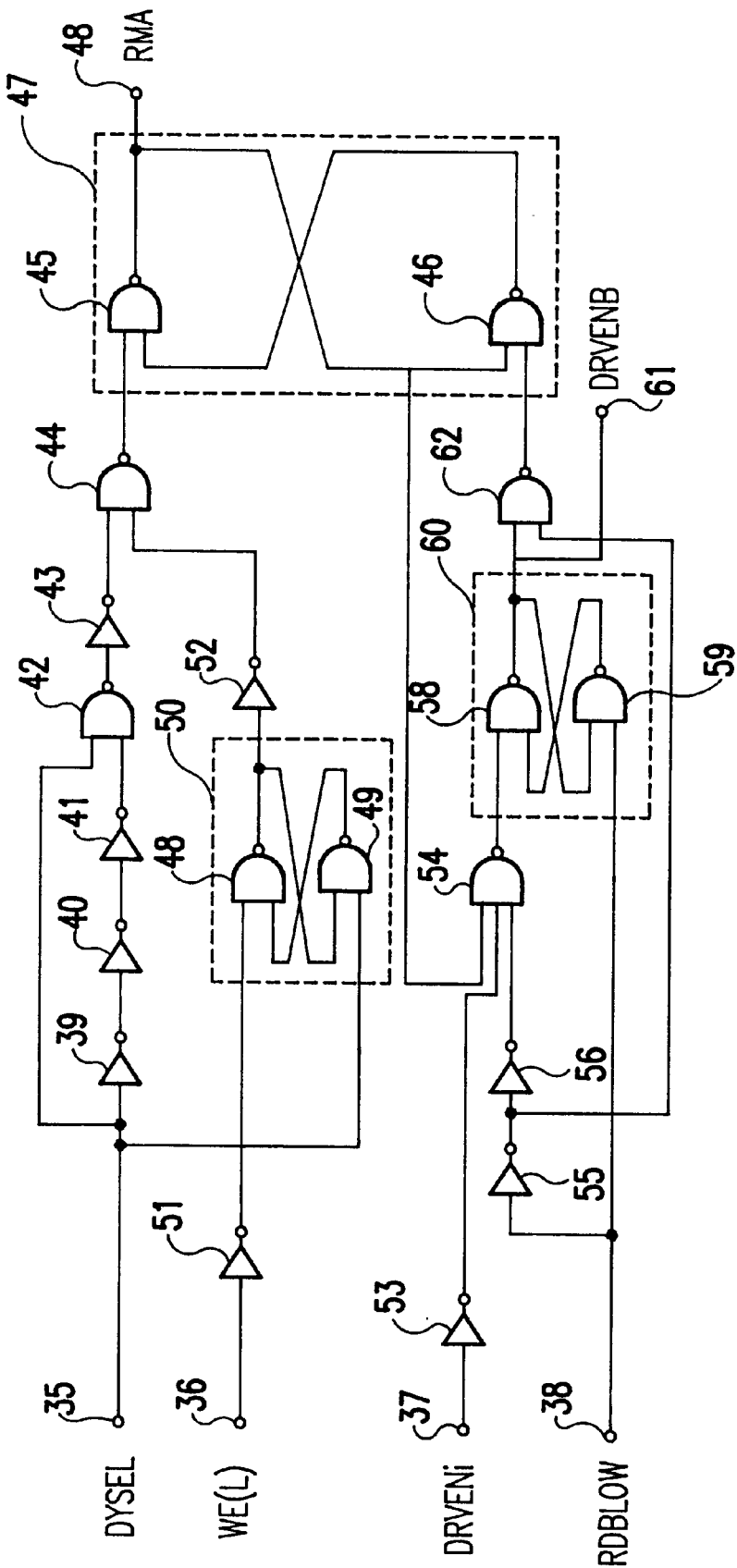
FIG. 2 is a circuit diagram illustrating one example of an activation signal generating circuit employed in the present invention.
Figure 3:
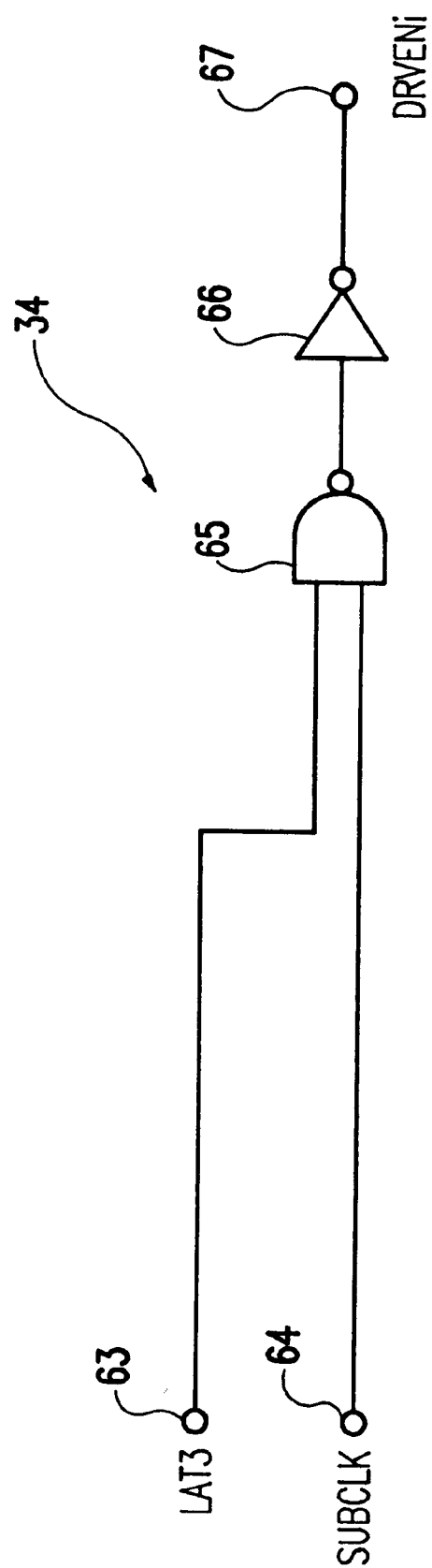
FIG. 3 is a circuit diagram depicting one example of a latency setting circuit employed in the present invention.

FIG. 2 is a circuit diagram showing one specific example of the activation signal generating circuit 14 electrically connected with the latency control circuit 34. FIG. 3 is a circuit diagram illustrating one specific example of the latency control circuit 34.

As shown in FIG. 2, the activation signal generating circuit 14 has four input terminals 35 through 38. The input terminal 35 is supplied with a delay signal (DYSEL) produced from the delay circuit 26. The delay signal (DYSEL) is inputted to one input terminal of a NAND 42 through inverters 39, 40 and 41 and the other input terminal of the NAND 42. The inverters 39 through 41 function as delay elements and the output of the NAND 42 is inputted to one input terminal of a NAND 44 through an inverter 43. An output terminal of the NAND 44 is electrically connected to an FF (Flip-Flop) latch circuit 47 composed of two NANDs 45 and 46. An activation signal (RMA) is outputted to an output terminal 48 of the latch circuit 47 according to the input of the delay signal (DYSEL) to the input terminal 35.

Further, the delay signal (DYSEL) inputted to the input terminal 35 is inputted to one input terminal of an FF latch circuit 50 composed of two NANDs 48 and 49. A data write control signal WE(L) outputted from the central control device, which is inputted to an input terminal 36, is inputted to the other input terminal of the FF latch circuit 50 through an inverter 51.

The output of the FF latch circuit 50 is inputted to the other input terminal of the NAND 44 through an inverter 52.

Therefore, when the delay signal (DYSEL) is received at the input terminal 35, the activation signal (RMA) is outputted to the data reading circuit 13 from the output terminal 48 of the latch circuit 47 unless the write control signal WE(L) is received at the input terminal 36 (so long as the write control signal is of "H").

On the other hand, when the write control signal WE(L) is received at the input terminal 36 even if the delay signal (DYSEL) is inputted to the input terminal 35, the activation signal (RMA) is prevented from being outputted through the output terminal 48 of the latch circuit 47, so that the activation of the data reading circuit 13 is inhibited. Thus, the data reading circuit 13 can be prevented from malfunctioning upon the write operation.

A drive signal (DRVENi), which is normally of "L", is supplied from the latency control circuit 34 to the input terminal 37 of the activation signal generating circuit 14.

The drive signal (DRVENi) is inputted to its corresponding input terminal of a NAND 54 through an inverter 53 together with one input terminal signal of the NAND 46 constituting the latch circuit 47.

Further, the input terminal 38 is inputted with a reset signal (RDBLOW) through the inverter 32 illustrated in FIG. 1. When the data output circuit 15 is in the preset state, the reset signal (RDBLOW) maintained at "H" is inputted to the other input terminal of the NAND 54 through inverters 55 and 56.

The output of the NAND 54 supplied with the activation signal (RMA), the inverted signal of the drive signal (DRVENi) and the reset signal (RDBLOW) is inputted to an FF latch circuit 60 composed of two NANDs 58 and 59 together with the reset signal (RDBLOW) inputted to the input terminal 38.

The output of the FF latch circuit 60 is outputted to the inverter 29 of the data transmission control circuit 27 shown in FIG. 1 through an output terminal 61 as the drive enable signal (DRVENB). Further, the output of the FF latch circuit 60 is inputted to the other input terminal of the NAND 46 of the FF latch circuit 47 through a NAND 62.

The drive enable signal (DRVENB) at the output terminal 61 substantially brings the data transmission control circuit 27 into conduction in response to the activation signal (RMA) at the output terminal 48 so long as the drive signal (DRVENi) at the input terminal 37 is maintained at ¢L£ and the reset signal (RDBLOW) at the input terminal 38 is maintained at "H". Thus, the outputs of the data reading circuit 13 are sequentially transmitted to their corresponding input terminals of the data output circuit 15 without being subjected to the time delay.

On the other hand, if the drive signal (DRVENi) at the input terminal 37 is brought to an "H" state or the reset signal (RDBLOW) is not brought to an "L" state even if the activation signal (RMA) is outputted from the output terminal 48, then the data transmission control circuit 27 cuts off continuity between the data reading circuit 13 and the data output circuit 15. Thus, the transfer of the output from the data reading circuit 13 to the data output circuit 15 through the data transmission control circuit 27 can be controlled according to "L" and the "L" state of the drive signal (DRVENi) or ¢H£ and the "L" state of the reset signal (RDBLOW).

Of the drive signal (DRVENi) and the reset signal (RDBLOW), the reset signal (RDBLOW) results in "L" when the data output circuit 15 is in a non-preset state. The data output circuit 15 is cut off in the present non-preset state.

The "H" and "L" states of the drive signal (DRVENi) will next be explained with reference to FIG. 3 showing the latency control circuit 34. One input terminal 63 of the latency control circuit 34 is maintained at "H" only when the latency 3 is set by the latency setting circuit 33. When the latency 1 or 2 is set, the latency signal (LAT3) maintained at "L" is inputted from the latency setting circuit 33. Further, the other input terminal 64 is supplied with an auxiliary or subclock (SUBCLK) indicative of a cycle twice the master clock pulse (CLK).

The signals inputted to both input terminals 63 and 64 are inputted to a NAND 65. The output of the NAND 65 is inputted from an inverter 66 to the input terminal 37 of the activation signal generating circuit 14 through an output terminal 67 as a drive signal (DRVENi).

So long as the CAS latency (CL) 1 or 2 is set by the latency setting circuit 33, the signal (LAT3) inputted to the input terminal 63 is maintained at "L". Therefore, the drive signal (DRVENI) is maintained at "L" regardless of the input signal (SUBCLK) of the input terminal 64.

Thus, when the latency 1 or 2 is set (CL=1 or CL=2), the drive enable signal (DRVENB) generated from the output terminal 61 of the activation signal generating circuit 14 is not affected by the drive signal (DRVENi). Therefore, the operation of the data transmission control circuit 27 is placed under the control of the reset signal (RDBLOW).

On the other hand, when the CAS latency 3 (CL=3) is set by the latency setting circuit 33, the signal (LAT3) inputted to the input terminal 63 is maintained at "H". Therefore, the input signal (SUBCLK) having a cycle corresponding to twice the master clock (CLK) is inputted to the input terminal 37 of the activation signal generating circuit 14 as the drive signal (DRVENi).

As a result, the drive enable signal (DRVENB) outputted from the activation signal generating circuit 14 to the data transmission control circuit 27 assumes the subclock (SUBCLK) indicative of the cycle corresponding to twice the master clock when the latency 3 (CL=3) is set. Therefore, the data transmission control circuit 27 controls the discontinuity between the data reading circuit 13 and the data output circuit 15 according to the subclock indicative of the cycle corresponding to twice the master clock (CLK), i.e., with a delay corresponding to two clock pulses in the master clock (CLK).

Thus, the discontinuity between the data reading circuit 13 and the data output circuit 15 can provide a suitable delay corresponding to the value of the set CAS latency when the CAS latency 3 (CL=3) is set, the data outputted from the data reading circuit 13 is not erroneously transmitted to the data output circuit 15 in a state of overlapping with the previous output data. It is thus possible to reliably prevent a malfunction developed due to the overlapping of the output data with another.

Figure 4:
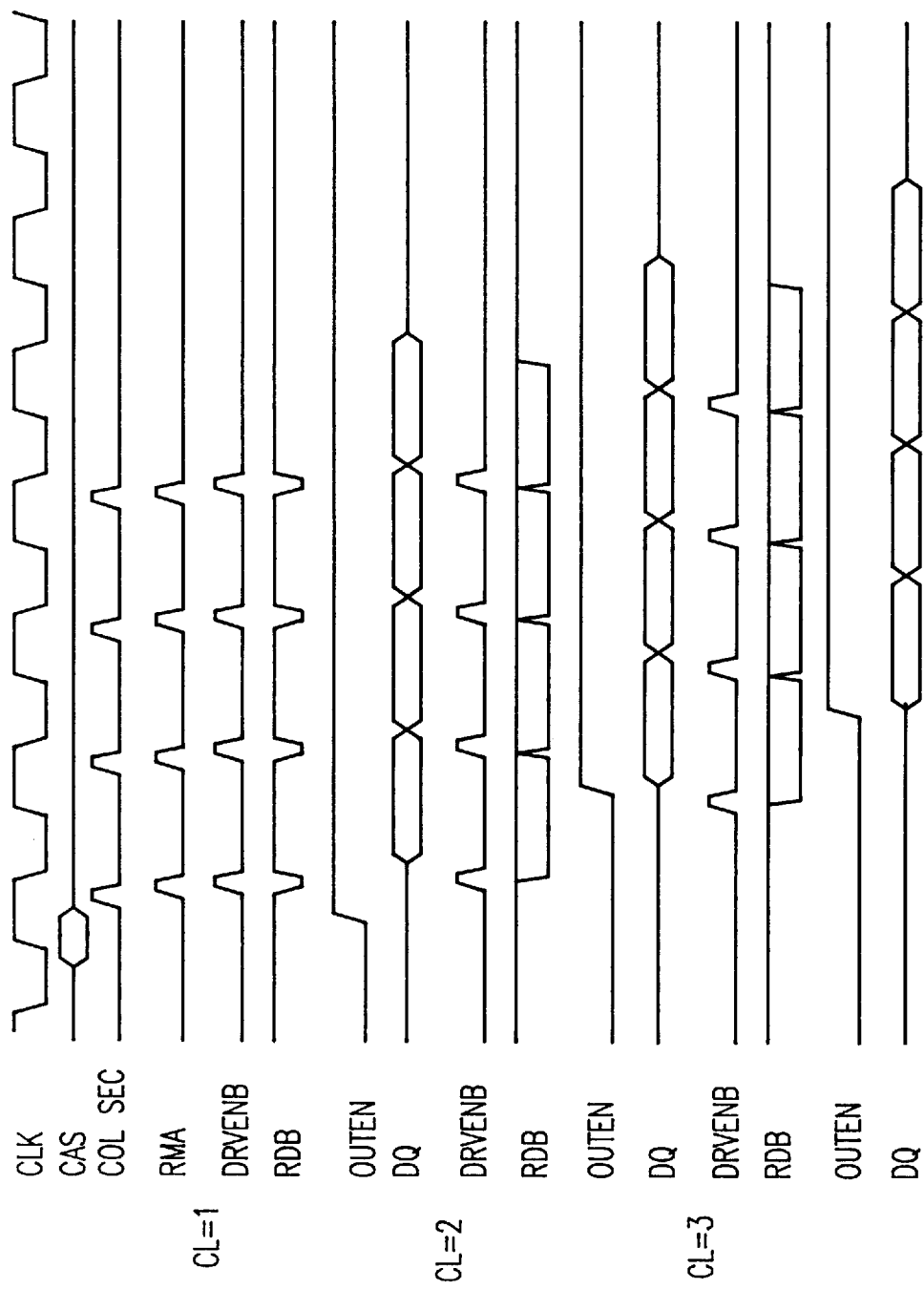
FIG. 4 is a timing chart for describing control signals employed in the semiconductor memory device according to the present invention.

FIG. 4 is a timing chart for describing the control signals and output data or the like at the time that the CAS latency is defined as 1 through 3 (CL=1 to 3).

When a delay signal (DYSEL) obtained from a column address selection signal (COLSEL) reaches the NAND 42 of the activation signal generating circuit 14 shown in FIG. 2 upon the CAS latency 1 (CL=1), a shot pulse "L" is inputted to the inverter 43 so that the output of the NAND 44 is brought to ¢L£. Therefore, an activation signal (RMA) outputted from the output terminal 48 of the latch circuit 47 results in "H".

Upon the CAS latency 1, a drive signal (DRVENi) inputted to the input terminal 37 of the activation signal generating circuit 14 is maintained at "L" as described above. A reset signal (RDBLOW) inputted to the input terminal 38 is maintained at ¢H£ because the data output circuit 15 is in a preset state. Therefore, the output of the NAND 54 is changed to ¢L£ in response to the transition of the activation signal (RMA) to "H".

As a result, the output terminal 61 of the latch circuit 60, i.e., the drive enable signal (DRVENB) is brought to ¢H£. Owing to the change in drive enable signal (DRVENB), the data transmission control circuit 27 electrically connects the data reading circuit 13 and the data output circuit 15 to each other. As a result, data on both output lines 13a and 13b of the data reading circuit 13 are transferred to the input terminal RDB of the data output circuit 15 and the input terminal RDBrev thereof complementary thereto.

Since the reset signal (RDBLOW) results in "L" owing to such data transfer as described above, the latch circuit 47 and latch circuit 60 of the activation signal generating circuit 14 are reset. Owing to the resetting of both latch circuits 47 and 60, the activation signal (RMA) at the output terminal 48 is maintained at "L" and the drive enable signal (DRVENB) is maintained at "L".

When the CAS latency 1 is set, the data output circuit 15 receives an output enable signal (OUTEN) used as a trigger input signal for the data output circuit 15 from the latency setting circuit 33. The output enable signal (OUTEN) rises without a delay from the master clock CLK in synchronism with a CAS signal. Thus, the data output circuit 15 outputs output data DQ having no delay from the CAS signal.

In the example illustrated in FIG. 4, any of output data DQ is shown as 4 burst lengths.

When the CAS latency 2 is set (CL=2), the data output circuit 15 is activated in the same manner as in the CAS latency 1 until it receives the output enable signal (OUTEN) from the latency setting circuit 33 as the trigger input signal.

The CAS latency 2 is different from the CAS latency 1 in that the output enable signal (OUTEN) produced from the latency setting circuit 33 is inputted with a delay corresponding to one clock pulse in the master clock pulse (CLK).

Due to the delay of one clock pulse, output data DQ is outputted from the data output circuit 15 with a delay of one clock from the CAS signal.

When the CAS latency 3 is set (CL=3), the output enable signal (OUTEN) produced from the latency setting circuit 33 is inputted with a delay corresponding to two clock pulses in the aster clock pulse (CLK) in the same manner as described in the CAS latency 2. Thus, output data DQ is outputted from the data output circuit 15 with a delay of two clocks from the CAS signal.

Further, since the discontinuity between the data reading circuit 13 and the data output circuit 15 can provide a suitable delay corresponding to the set CAS latency 3 as described above when the CAS latency 3 is set (CL=3), the data outputted from the data reading circuit 13 is not erroneously transmitted to the data output circuit 15 in a state of overlapping with the previous output data. It is thus possible to reliably prevent a malfunction developed due to the overlapping of the output data with another.

In the semiconductor memory device 10 according to the present invention, the processing time between the input of the column address selection signal (COLSEL) to the memory array 11 and the reading of the data from the memory array 11, i.e., the processing time required during the activation of the data reading circuit 13 is not restrained by the clock as described above. Thus, since the processing time can be set independent of the clock frequency, flexibility can be given to the operation of a system.

Therefore, according to the semiconductor memory device 10, a stage from a first to a second stages, which corresponds to a process from the latching of a column enable signal to the latching of read data can be executed in a 16ns cycle in, e.g., an example of 125 MHz (8ns cycle).

While the reset signal (RDBLOW) varied in relation to the change in input terminal voltage of the data output circuit 15 has been used as the rest signal for each of the drive enable signal (DRVENB) and the activation signal (RMA) in the above description, a shot pulse having a predetermined period or cycle may be adopted as the reset signal.

Further, the present invention can suitably be applied even to a pipe line process. It is thus possible to implement a higherspeed process.

In the semiconductor memory device according to the present invention, an activation signal for activating a data reading circuit is generated according to a delay signal delayed a predetermined time amount with respect to an address signal. Therefore, the data reading circuit for reading data from a memory array is asynchronously activated without being controlled synchronously with a clock and with a predetermined time delay after the input of the address signal to the memory array.

Thus, according to the present invention, since the processing time between the input of the address signal to the memory array and the reading of the data from the memory array is not restrained by a clock and can be set independent of a clock frequency, flexibility can be given to the operation of a system.

Further, the present invention is extremely advantageous to the achievement of a high-speed operation because the asynchronization of the operation of the data reading circuit can provide an increase in clock frequency without reference to the data read operation of the data reading circuit.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
    a memory array which receives an address signal outputted in response to an address control signal synchronized with a clock pulse and outputs a data signal stored in a memory cell located at an address corresponding to the address signal;
    an activation signal generating circuit which receives a delay signal corresponding to said address signal and generates an activation signal in response to said delay signal;
    a data reading circuit which receives said activation signal and in response to said activation signal reads said data signal outputted from said memory array; and
    a data output circuit which receives an enable signal synchronized with said clock pulse and, in response to said enable signal, outputs said data signal read by said data reading circuit.

2. A semiconductor memory device according to claim 1, wherein said delay signal is generated by a delay circuit supplied with the address signal.

3. A semiconductor memory device according to claim 2, wherein said data reading circuit reads the data signal outputted from said memory array upon receipt of the activation signal and latches an output thereof corresponding to the data signal until said data reading circuit receives a subsequent activation signal therein.

4. A semiconductor memory device according to claim 3, further comprising a data transmission control circuit for transferring the data signal from said data reading circuit to said data output circuit.

5. A semiconductor memory device according to claim 4, further comprising a latency setting circuit for setting a latency to provide a delay of a predetermined number of clock pulses in the data signal output from said data output circuit, said delay being developed from the address control signal, said latency setting circuit providing said enable signal to said data output circuit and a predetermined latency signal to said activation signal generating circuit.

6. A semiconductor memory device according to claim 5, wherein said activation signal generating circuit transmits a control signal to said data transmission control circuit for providing a delay of a predetermined number of clock pulses for transferring said data signal from said data reading circuit to said data output circuit, when said activation signal generating circuit receives said predetermined latency signal indicating a predetermined latency from said latency setting circuit.

7. A semiconductor memory device according to claim 6, wherein said latency setting circuit is capable of selectively setting three types of latencies composed of a latency 1, a latency 2 and a latency 3, and said latency setting circuit transmits latency signals for providing delays of a zero clock pulse and one clock pulse to said data output circuit as the enable signal respectively upon setting of said latency 1 and said latency 2, whereas upon setting of said latency 3, said latency setting circuit transmits a latency signal for providing a delay of two clock pulses to said data output circuit as the enable signal.

8. A semiconductor memory device according to claim 7, wherein said data output circuit outputs a predetermined voltage value to an input terminal thereof as an initialized value each time said data output circuit receives an enable signal therein, and said activation signal generating circuit activates said data transmission control circuit so as to allow the data signal produced from said data reading circuit to pass through said data output circuit without a time delay unless said activation signal generating circuit receives the predetermined latency signal indicative of the latency 3 from said latency setting circuit.

9. A semiconductor memory device according to claim 2, 3, 4, 5 or 6, wherein said memory array has a plurality of bit lines and a plurality of word lines, said address control signal comprises a CAS signal which is sent to a column decoder, and said address signal is sent to said memory array from said column decoder, said address signal comprising a column selection signal.

10. A semiconductor memory device according to claim 9, wherein the delay circuit generates the delay signal from the column selection signal generated by said column decoder.

11. A semiconductor memory device according to claim 9, wherein said memory array outputs a pair of mutually-complementary data signals from a first bit line for a memory cell corresponding to the column selection signal and a second bit line paired with the first bit line to said data reading circuit in response to the column selection signal.

12. A semiconductor memory device according to claim 11, wherein said data reading circuit has a differential amplifying function for outputting a pair of amplified complementary data signals obtained by amplifying said pair of mutually-complementary data signals to predetermined values respectively, based on a difference in voltage between said pair of mutually-complementary data signals.

13. A semiconductor memory device according to claim 6, wherein:

said memory array outputs a pair of mutually-complementary data signals from a first bit line for a memory cell corresponding to the column selection signal and a second bit line paired with the first bit line to said data reading circuit in response to the column selection signal;

said data reading circuit has a differential amplifying function for outputting a pair of amplified complementary data signals obtained by amplifying said pair of mutually-complementary data signals to predetermined values respectively, based on a difference in voltage between said pair of mutually-complementary data signals; and said data transmission control circuit comprises a pair of NOR circuits each having a pair of input terminals, each of said pair of amplified complementary data signals being provided to a first input terminal of each of said pair of NOR circuits respectively, said control signal transmitted said activation signal generating circuit being input to a second input terminal of each of said pair of NOR circuits, and said pair of NOR circuits providing NOR output data signals to said data output circuit.

14. A semiconductor memory device comprising:

a plurality of memory cells arranged in a matrix with rows and columns and storing data therein respectively;

a column selection circuit which receives a column address signal in response to a clock therein and outputs data stored in a memory cell among said plurality of memory cells located at an address corresponding to the column address signal;

a data output circuit for outputting data corresponding to the data outputted from said column selection circuit, in response to control signals; and a control circuit for outputting the control signals, corresponding to the column address signal.

15. A semiconductor memory device according to claim 14, wherein said control signals include a first signal and a second signal outputted with a delay of a predetermined interval from the first signal, and said data output circuit receives data outputted from said column selection circuit therein in response to the first signal and outputs the outputted data in response to the second signal.

* * * * *